United States Patent
Liu et al.

(10) Patent No.: US 10,504,605 B2
(45) Date of Patent: Dec. 10, 2019

(54) METHOD AND SYSTEM FOR TESTING FIRMWARE OF SOLID-STATE STORAGE DEVICE, AND ELECTRONIC APPARATUS

(71) Applicant: National Tsing Hua University, Hsinchu (TW)

(72) Inventors: Ren-Shuo Liu, Hsinchu (TW); Yun-Sheng Chang, Hsinchu (TW); Chih-Wen Hung, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 16/159,045

(22) Filed: Oct. 12, 2018

(65) Prior Publication Data

US 2019/0130990 A1 May 2, 2019

Related U.S. Application Data

(60) Provisional application No. 62/580,593, filed on Nov. 2, 2017.

(51) Int. Cl.
| | |
|---|---|
| *G06F 12/10* | (2016.01) |
| *G11C 29/18* | (2006.01) |
| *G11C 29/10* | (2006.01) |
| *G06F 12/02* | (2006.01) |

(52) U.S. Cl.
CPC .......... *G11C 29/18* (2013.01); *G06F 12/0246* (2013.01); *G11C 29/10* (2013.01); *G06F 2212/7201* (2013.01)

(58) Field of Classification Search
CPC ............................ G11C 29/18; G06F 12/0246
USPC ........................................................ 711/202
See application file for complete search history.

(56) References Cited

U.S. PATENT DOCUMENTS

| | | | |
|---|---|---|---|
| 9,830,099 B1 * | 11/2017 | Johansson | G06F 3/0623 |
| 2011/0296079 A1 | 12/2011 | Kotzur et al. | |
| 2013/0091322 A1 * | 4/2013 | Wang | G06F 12/0246 711/103 |
| 2015/0006591 A1 | 1/2015 | Lee et al. | |

FOREIGN PATENT DOCUMENTS

| | | |
|---|---|---|
| CN | 103399783 A | 11/2013 |
| TW | 201723853 A | 7/2017 |

* cited by examiner

*Primary Examiner* — Jae U Yu
(74) *Attorney, Agent, or Firm* — Birch, Stewart, Kolasch & Birch, LLP

(57) ABSTRACT

A method for testing firmware of an SSD includes: controlling a main memory to emulate volatile and non-volatile memories of the SSD, fetching a testing sequence and a testing criterion, fetching read/write operations from binary codes generated by compiling the firmware, determining whether the read/write operations are associated with a marker, executing the read/write operations when a result of determination is affirmative, otherwise discarding a read/write of data, monitoring whether processes of executing of the read/write operations meet the testing criterion, and generating a result of a test of the firmware when it is monitored that the testing criterion is met.

26 Claims, 5 Drawing Sheets

METHOD AND SYSTEM FOR TESTING FIRMWARE OF SOLID-STATE STORAGE DEVICE, AND ELECTRONIC APPARATUS

CROSS-REFERENCE TO RELATED APPLICATION

This application claims priority of U.S. Provisional Patent Application No. 62/580,593, filed on Nov. 2, 2017.

FIELD

The disclosure relates to a method and a system, and more particularly to a method and a system for testing firmware of a solid-state storage device, and an electronic apparatus that is provided with a certification indicating that a firmware of a solid-state storage device included in the electronic apparatus has passed the test.

BACKGROUND

Flash translation layers (FTLs) are the core embedded software (also known as firmware) of NAND flash-based solid-state drives (SSDs). FTLs are responsible for relocating flash data, erasing outdated flash data, and calculating flash addresses for every read or write request from the computer.

For the purpose of testing and validating FTLs, FTL developers perform real SSD-based stress tests to discover FTL bugs. For example, referring to FIG. 1, by executing conventional stress-testing software 11, a computer 12 can generate intensive read and write traffic to stress an SSD 13. The FTL 14 run by an embedded CPU 15 of the SSD 13 is considered "probably buggy" if data corruption, abnormal SSD disconnection, or request timeout occurs during tests. This real SSD-based testing methodology has two fundamental drawbacks and limitations.

First, SSDs, especially flash memories in the SSDs, exhibit a quite limited access speed, which poses speed limitations on stress tests. For example, for an NVMe PCIe SSD with a write speed of 0.73 GB/s on average, it takes about 23 minutes for a tester to stress test an FTL with 1 TB mixed writes (1000/0.73/60≈23 min).

Second, investigating a failure occurring during real SSD-based FTL tests is burdensome for FTL developers because it involves complicated factors including host OS (e.g., Windows or Linux) compatibility, mother board compatibility, cable signal quality, flash memory quality, power supply stability, FTL firmware, and non-FTL firmware.

SUMMARY

Therefore, an object of the disclosure is to provide a method and a system for testing firmware of a solid-state storage device that can alleviate at least one of the drawbacks of the prior art, and an electronic apparatus that is provided with a certification indicating that a firmware of a solid-state storage device included in the electronic apparatus has passed the test.

According to one aspect of the disclosure, the method for testing firmware of a solid-state storage device is to be implemented by a computing apparatus which includes a central processing unit (CPU), a main memory, and a storage that stores at least one testing criterion. The method includes:

providing, by one of the main memory and the storage, binary codes generated by compiling the firmware of the solid-state storage device according to an instruction set architecture of the computing apparatus;

controlling, by the CPU, the main memory to emulate a volatile memory of the solid-state storage device to provide an emulated volatile memory;

controlling, by the CPU, the main memory to emulate a non-volatile memory of the solid-state storage device to provide an emulated non-volatile memory;

fetching, by the CPU, a testing sequence which includes a read request to access a logical address of the solid-state storage device and a write request to access another logical address of the solid-state storage device;

fetching, by the CPU according to the testing sequence, a read operation and a write operation from the binary codes;

determining, by the CPU, whether the read operation is associated with a marker indicating that data to be read from a physical address corresponding to the logical address are unrelated to firmware operation;

executing, by the CPU when it is determined that the read operation is not associated with the marker, the read operation thus fetched to read the data from the physical address of one of the emulated volatile memory and the emulated non-volatile memory specified by the read operation;

discarding, by the CPU when it is determined that the read operation is associated with the marker, a read of the data from the physical address specified by the read operation thus fetched;

determining, by the CPU, whether the write operation is associated with a marker indicating that data to be written to another physical address corresponding to the another logical address are unrelated to firmware operation;

executing, by the CPU when it is determined that the write operation is not associated with the marker, the write operation thus fetched to write the data to the another physical address of one of the emulated volatile memory and the emulated non-volatile memory specified by the write operation;

discarding, by the CPU when it is determined that the write operation is associated with the marker, a write of the data to the another physical address specified by the write operation thus fetched;

monitoring, by the CPU, whether processes of execution of the read operation and the write operation meet the testing criterion; and generating, by the CPU, a result of a test of the firmware when it is monitored that the testing criterion is met.

According to another aspect of the disclosure, the system for testing firmware of a solid-state storage device includes a computing apparatus which includes a main memory, a storage, and a central processing unit (CPU). The storage stores a testing criterion and is configured to provide binary codes which are generated by compiling the firmware of the solid-state storage device according to an instruction set architecture of the computing apparatus. The CPU is electrically connected to the main memory and the storage, and is configured to control said main memory to emulate a volatile memory and a non-volatile memory of the solid-state storage device to provide an emulated volatile memory and an emulated non-volatile memory, fetch a testing sequence which includes a read request to access a logical address of the solid-state storage device and a write request to access another logical address of the solid-state storage device, fetch, according to the testing sequence, a read operation and a write operation from the binary codes stored in said storage, determine whether the read operation is associated with a marker indicating that data to be read from a physical address corresponding to the logical address are unrelated to firmware operation, execute, when it is determined that the read operation is not associated with the marker, the read operation thus fetched to read the data from the physical address of one of the emulated volatile memory and the emulated non-volatile memory specified by the read operation, discard, when it is determined that the read operation is associated with the marker, a read of the data from the physical address specified by the read operation thus fetched, determine whether the write operation is associated with a marker indicating that data to be written to another physical address corresponding to the another logical address are unrelated to firmware operation, execute, when it is determined that the write operation is not associated with the marker, the write operation thus fetched to write the data to the another physical address of one of the emulated volatile memory and the emulated non-volatile memory specified by the write operation, discard, when it is determined that the write operation is associated with the marker, a write of the data to the another physical address specified by the write operation thus fetched, monitor whether processes of execution of the read operation and the write operation meet the testing criterion, and generate a result of a test of the firmware when it is monitored that the testing criterion is met.

According to further another aspect of the disclosure, the electronic apparatus includes a solid-state storage module. Firmware associated with the solid-state storage module has passed a test that is performed through the method for testing firmware of a solid-state storage device. The electronic apparatus is provided with a certification indicating that the firmware of the solid-state storage module has passed the test.

An effect of the method for testing firmware of a solid-state storage device according to the disclosure resides in that, a functional simulation methodology, i.e., virtual stress testing (VST), focusing on testing and validating FTLs is provided. VST enables FTL developers to compile and execute native SSD FTL code on PCs or servers without the need of SSD hardware, and to carry out tests on FTLs without SSD speed limitations. VST utilizes a main memory on a personal computer or a server to emulate various types of memory in SSDs (e.g., SRAM, DRAM, and flash). A data structure that can efficiently represent large flash capacity of an SSD is introduced in the disclosure.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
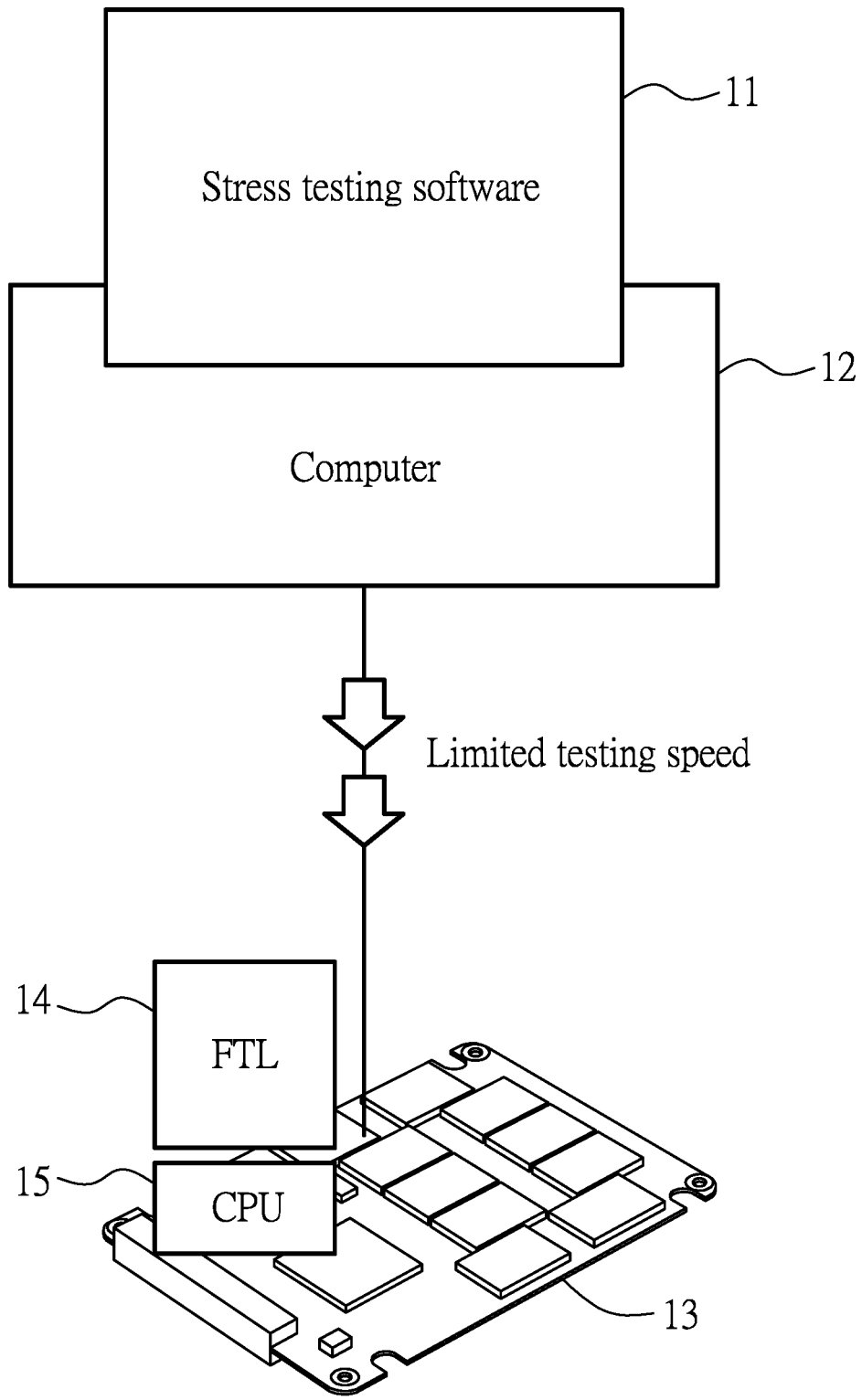
FIG. 1 is schematic diagram illustrating a conventional approach of real SSD-based test to be performed by a computer directly on an SSD.
Figure 2:
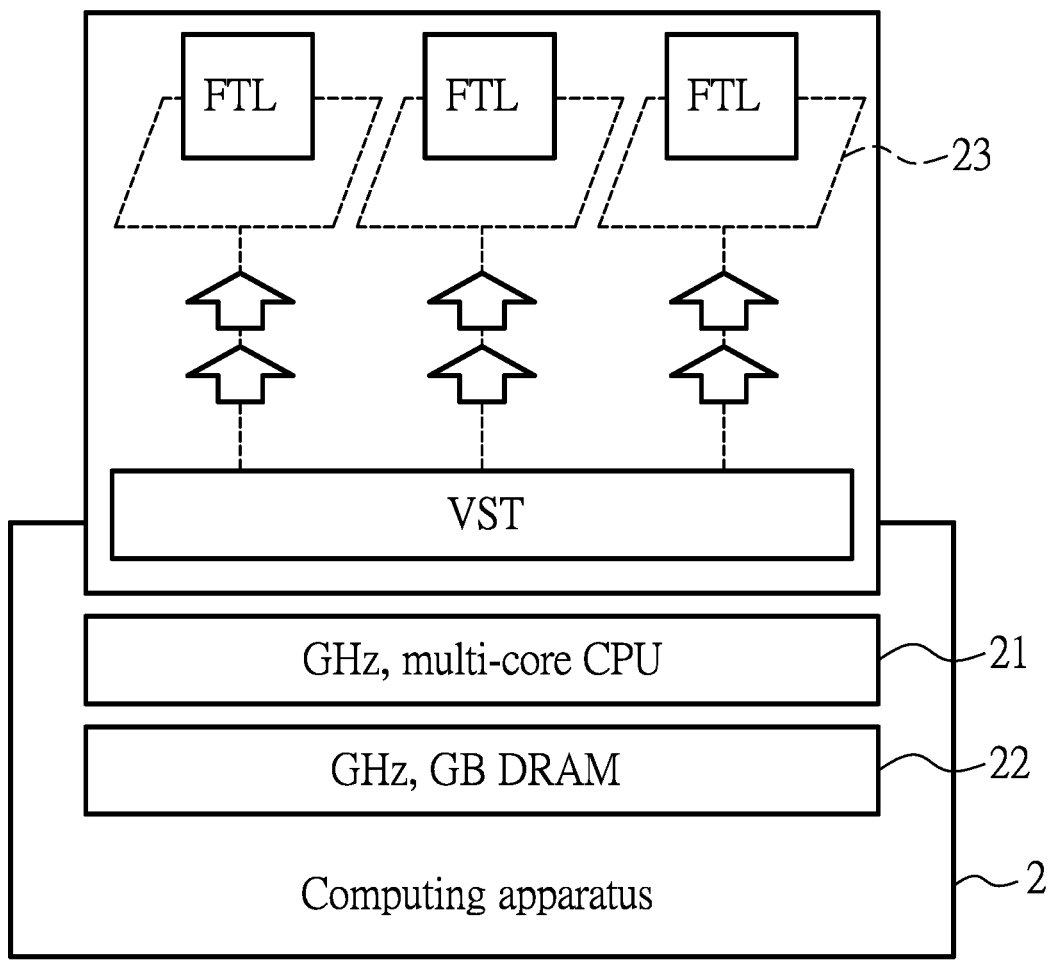
FIG. 2 is a schematic diagram illustrating a system including a computing apparatus which is configured to implement a method for testing firmware of a solid-state storage device according to the disclosure.

Referring to FIG. 2, an embodiment of a system including a computing apparatus 2 which is configured to implement a method for testing firmware of a solid-state storage device according to the disclosure is illustrated. The computing apparatus 2 includes a central processing unit (CPU) 21, a main memory 22, and a storage (not shown) that stores at least one testing criterion. In this embodiment, the computing apparatus 2 is implemented by one of a personal computer, a notebook computer, a server or any other electronic device that is provided with data computing capability to carry out functions mentioned in this disclosure. The CPU 21 may be replaced by other processors, such as a microprocessor, an application-specific instruction set processor (ASIP), a digital signal processor, etc. The main memory 22 is a primary storage directly accessible to the CPU 21 and is usually (but not necessarily) implemented as a volatile computer memory, such as a dynamic random-access memory (DRAM), a double data rate synchronous DRAM (DDR SDRAM) and so forth. The storage is a secondary storage that is usually (but not necessarily) indirectly accessible by the CPU 21 via input/output channels, and is usually (but not necessarily) implemented as a non-volatile computer memory such as a hard disk drive, or a rotating optical storage device, such as CD and DVD drives. The solid-state storage device is exemplified by a solid-state drive (SSD) in this disclosure. However, in other embodiments, the solid-state storage device may be one of a secure digital (SD) card, a USB flash drive, an embedded MultiMediaCard (eMMC) chip, a universal flash storage (UFC) card, and so on. The SSD includes an SSD controller that executes the firmware including a flash translation layer (FTL). The SSD further includes a volatile memory (e.g., an SRAM main memory and an off-chip DRAM) and a non-volatile memory (e.g., a NAND flash memory including flash elements, a 3D crosspoint memory, a phase-change memory, a resistive memory, or a spin-transfer-torque memory).

Figure 3:
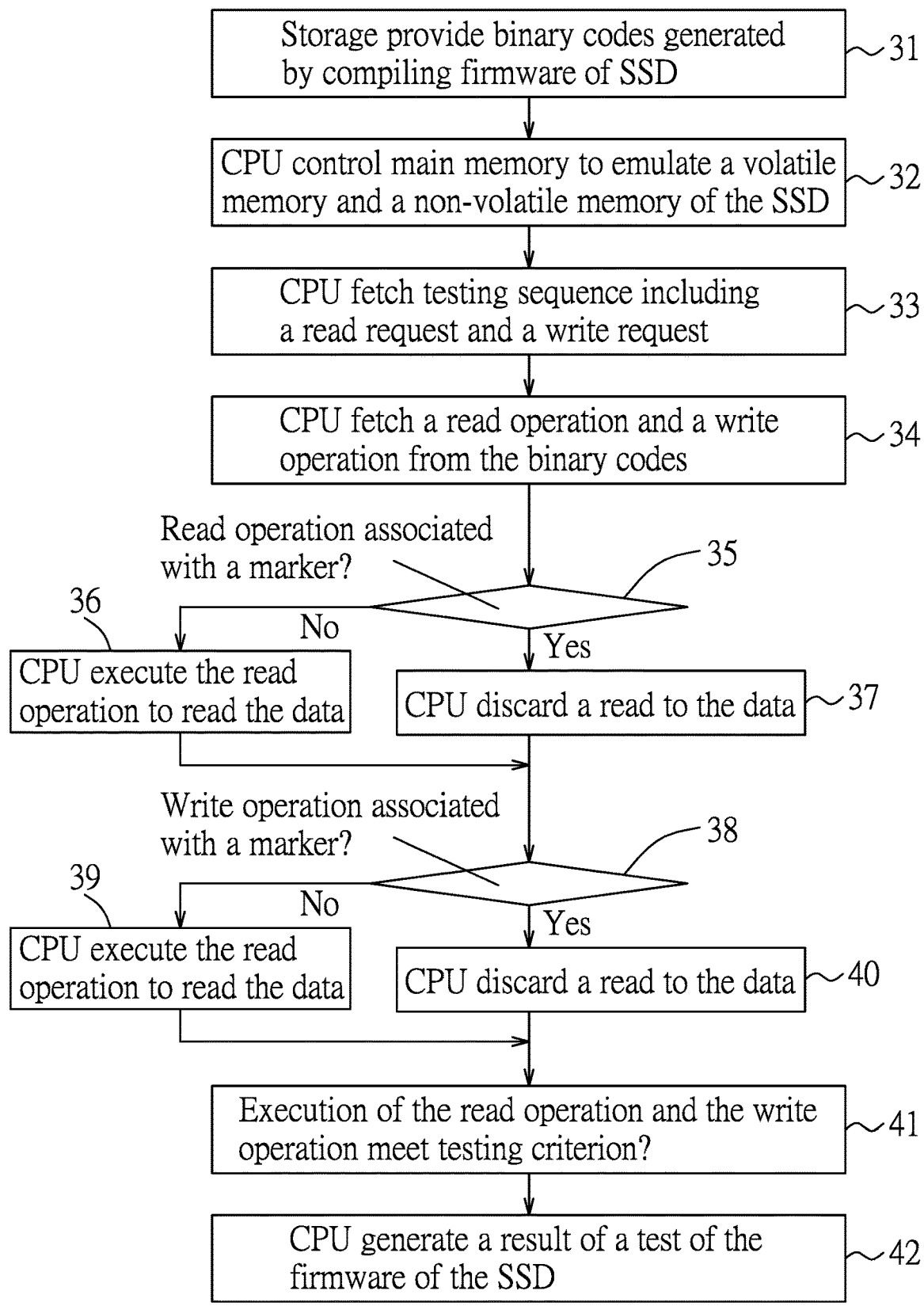
FIG. 3 is a flow chart illustrating an embodiment of the method for testing firmware of a solid-state storage device according to the disclosure.

Referring to FIG. 3, an embodiment of the method for testing firmware of a solid-state storage device according to the disclosure is illustrated, and is referred to as virtual stress testing, VST, hereinafter.

In step 31, the storage of the computing apparatus 2 provides binary codes generated by compiling the firmware of the solid-state storage device (e.g., an SSD) according to an instruction set architecture of the computing apparatus 2. Specifically, in order to enable the firmware of the SSD to be tested on the computing apparatus 2, the FTL of the firmware is compiled by a compiler according to the X86 instruction set architecture to result in binary codes which are exemplified by a dynamically linked shared object that has the file extension of ".so", and the binary codes are X86 binary codes to be stored in the storage of the computing apparatus 2.

Figure 4:
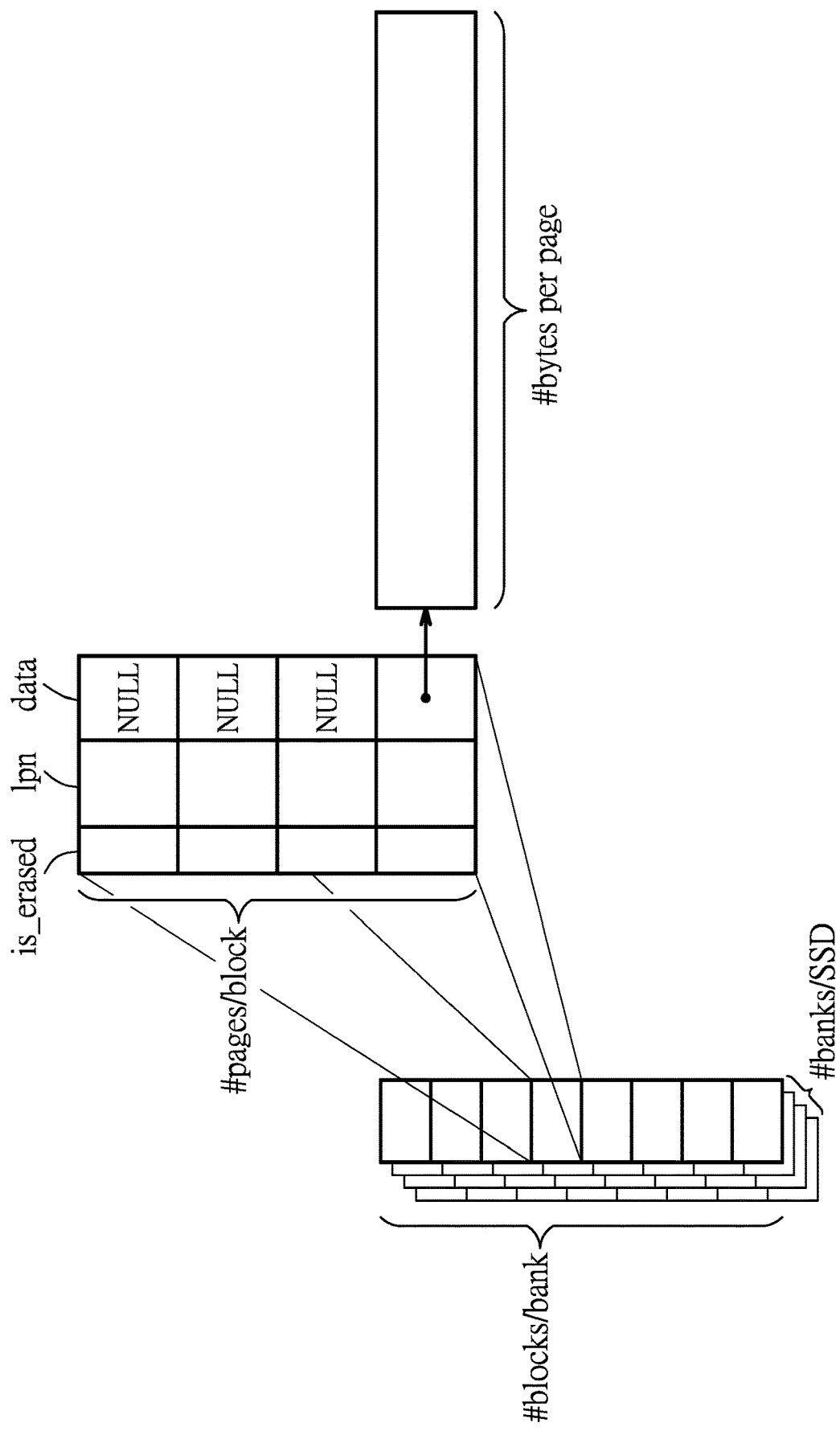
FIG. 4 is a schematic diagram illustrating an embodiment of a data structure for emulating a flash memory of an SSD using a main memory of the computing apparatus.

In step 32, the CPU 21 of the computing apparatus 2 controls the main memory 22 of the computing apparatus 2 to emulate a volatile memory and a non-volatile memory of the SSD to provide an emulated volatile memory and an emulated non-volatile memory. Specifically, the VST emulates hardware of the SSD, such as the volatile memory (i.e., SRAM or DRAM) and the non-volatile memory (i.e., the flash memory) using the main memory 22 of the computing apparatus 2 to achieve virtual SSD hardware 23 (see FIG. 2). Moreover, referring to FIG. 4, a data structure is proposed to emulate the flash memory of an SSD using the main memory 22 of the computing apparatus 2. The CPU 21 is configured to establish the data structure for the non-volatile memory of the SSD in the main memory 22. The data structure includes multiple arrays of subarrays. Each of the arrays corresponds to a bank (also called a channel or a gang) of flash elements of the SSD. Each subarray represents a block of multiple flash pages, and each of the flash pages includes an is erased field, an lpn field, and a data pointer field. The is_erased field indicates whether the flash page is erased, the lpn field is a tag recording the logical page number of the flash page, and the data pointer field is allocated memory space if data of the flash page are not omittable. It should be noted that physical addresses of the volatile memory and the non-volatile memory of the SSD should be reproduced in the emulated volatile memory and the emulated non-volatile memory so as to ensure correct emulation of the memories of the SSD.

In step 33, the CPU 21 fetches a testing sequence which includes a read request to access a logical address of the SSD and a write request to access another logical address of the SSD. Specifically, application programming interfaces (APIs) related to input/output (I/O) and supported by the VST are introduced. The APIs related to I/O generate the read request (s) or the write request (s) for an FTL under test. The arguments for the two APIs are starting logical block address (LBA) and length of the requested data. Furthermore, emulating I/O requests of an SSD is done by synthesizing the read and write requests according to trace files or a random sequence generated by a pseudo-random number seed. For example, trace emulating is utilized for emulating a video recording scenario, where host data (e.g., emulated video data) are to be written into the SSD. The testing sequence fetched by the CPU 21 is based on an order of data or an amount of data to be read/written in the scenario emulated. The VST according to the disclosure also offers other sets of generic APIs such as reading an emulated DRAM word or erasing an emulated flash block to interface FTL objects with the emulated hardware of the SSD.

In step 34, the CPU 21 fetches, according to the testing sequence, a read operation and a write operation from the binary codes stored in the storage. Specifically, the firmware of the SSD is constituted by firmware source codes that include the following operations containing instructions and function calls: write a volatile memory of the SSD; read a volatile memory of the SSD; write a non-volatile memory of the SSD; and read a non-volatile memory of the SSD. The firmware of the SSD is compiled to obtain the binary codes. In one embodiment, the binary codes are executed by the CPU 21 to translate the read request and the write request into the read operation and the write operation, respectively, to translate the logical address to be accessed according to the read request into a physical address of one of the emulated volatile memory and the emulated non-volatile memory, and to translate the another logical address to be accessed according to the write request into another physical address of one of the emulated volatile memory and the emulated non-volatile memory. Since the read operation and the write operation are fetched according to the read request and the write request of the testing sequence, the read operation specifies the physical address corresponding to the logical address of the SSD, access to which is requested by the read request, and the write operation specifies the another physical address corresponding to the logical address of the SSD requested by the write request. Please note that the testing sequence can include millions of (or even more) requests in total, and each request can be translated to one or multiple operations.

In step 35, the CPU 21 determines whether the read operation is associated with a marker indicating that data to be read from the physical address to be accessed are unrelated to firmware operation. The marker is introduced in this disclosure for the purpose of addressing an issue of excessive memory usage and redundant memory accesses when the firmware of the SSD is directly simulated on a computer or a server. Differentiating host data that are stored in flash memory but are not related to firmware operation, such as music files, image files or video files, from other data that are associated with firmware operation significantly reduces the memory traffic and footprints for simulating a large-capacity SSD and boosts the testing speed. Therefore, the marker(s) is (are) expected to be added to annotate data differentiating information in FTLs of firmware of SSDs for future references when flash APIs are invoked. In one embodiment, the marker is added to the read operation or the write operation during the process when the binary codes are executed by the CPU 21 to translate the read request or the write request into the read operation or the write operation.

Moreover, in real operations of an SSD, FTL of firmware frequently performs RAM fills and RAM copies, but a significant portion of them are in fact irrelevant to FTL tests. A lot of redundant operations result from filling a RAM buffer with 0xFF bytes when an erased page is read, or from copying data between RAM buffers when a write request triggers a read-modify-write procedure, but it turns out that the FTL does not need these RAM data. Similar to handling flash data, the marker(s) is expected to be added to annotate in FTLs whether each RAM fill or RAM copy is omittable during FTL tests.

In this embodiment, the firmware operation includes, but is not limited to, mapping between a logical address and a physical address.

When it is determined that the read operation is not associated with the marker, in step 36, the CPU 21 executes the read operation thus fetched to read the data from the physical address of one of the emulated volatile memory and the emulated non-volatile memory specified by the read operation. In other words, when it is determined by the CPU 21 that the data to be read from the physical address to be accessed are related to firmware operation and do not belong to music files, image files, video files, etc., the read operation is executed completely to read the data from the physical address of said one of the emulated volatile memory and the emulated non-volatile memory.

When it is determined that the read operation is associated with the marker, in step 37, the CPU 21 discards a read of the data from the physical address specified by the read operation thus fetched. It is noted that the CPU 21 in this step merely discards an action of reading the data, but still performs actions of, for example, reading lpn information and reading "is_erased" information.

In step 38, the CPU 21 determines whether the write operation is associated with the marker indicating that data to be written to the another physical address to be accessed are unrelated to firmware operation. Detailed operation of this step is similar to that of step 35, and description of which is omitted herein for the sake of brevity.

When it is determined that the write operation is not associated with the marker, in step 39, the CPU 21 executes the write operation thus fetched to write data to the another physical address of one of the emulated volatile memory and the emulated non-volatile memory specified by the write operation. In other words, when it is determined by the CPU 21 that the data to be written to the another physical address to be accessed are related to firmware operation and do not belong to music files, image files, video files, etc., the write operation is executed completely to write the data to the another physical address of said one of the emulated volatile memory and the emulated non-volatile memory.

When it is determined that the write operation is associated with the marker, in step 40, the CPU 21 discards a write of the data to the another physical address specified by the write operation thus fetched. It is noted that the CPU 21 in this step merely discards an action of writing the data, but still performs actions of, for example, setting lpn information and setting "is_erased" information.

In step 41, the CPU 21 monitors whether processes of execution of the read operation and the write operation meet the testing criterion. In one embodiment, the testing criterion that indicates a failed stress test includes at least one of: firmware not having processed requests for a period longer than a threshold (i.e., firmware hangs); an (emulated) flash page being written twice without an erase; multiple (emulated) flash pages in a block being not written according to a predefined order; or the LBA read out from an (emulated) flash page being different from the LBA requested by a read request. In one embodiment, the testing criterion that indicates a passed stress test includes at least one of: the total number of read and write requests exceeding a certain multiple (e.g., 100 times) of the capacity of emulated flash; the total number of erase operations exceeding a certain predetermined number; or the total number of power-off and power-loss events exceeding a certain preset number.

In step 42, the CPU 21 generates a result of a test (e.g., passed or failed the VST) of the firmware of the SSD when it is monitored that the testing criterion is met. If the firmware of the SSD does not pass the test, the result includes outcomes of the VST which provide informative clues about in which function the bug is detected and what kind of ill behaviors the bug exhibits. Accordingly, engineers are able to pinpoint the buggy code(s) in FTL firmware of an SSD.

With respect to detailed operations regarding steps 35 and 38 of this embodiment, the marker is to be added as an argument to the read operation and the write operation to indicate that data to be read from the physical address specified by the read operation and data to be written to the another physical address specified by the write operation are unrelated to the firmware operation. The CPU 21 determines whether the read operation is associated with a marker by determining whether an argument of the read operation is labeled by the marker indicating that data to be read from the physical address to be accessed are unrelated to the firmware operation, and determines whether the write operation is associated with a marker by determining whether an argument of the write operation is labeled by the marker indicating that data to be written to the another physical address to be accessed are unrelated to the firmware operation. Referring to Table 1 below, the marker is exemplified to be added to label the read operation (see lines 6 and 8 in the pseudocode of FTL.c).

TABLE 1

```
TestModeMain.c
1:   main( )
2:   {
3:      While(1){
4:         (ReqType, ReqAddr, BufAddr1) = GetReq( );
5:         HostReq(ReqType, ReqAddr, BufAddr1);
6:      }
7:   }
FTL.c
1:   HostReq(ReqType, ReqAddr, BufAddr1)
2:   {
3:      if (ReqType == Read) {
4:         FlashPageRead(FlashAddr2, BufAddr2, FTLData);
5:         FlashAddr1 = Buf[BufAddr2];
6:         FlashPageRead(FlashAddr1, BufAddr1, NotFTLData);
7:      } else {
8:         FlashPageWrite(FlashAddr3, BufAddr1, NotFTLData);
9:         Buf[BufAddr3] = FlashAddr3;
10:        FlashPageWrite(FlashAddr4, BufAddr3, FTLData);
11:     }
12:  }
TestModeFlash.c
1:   FlashPageRead(FlashAddr, BufAddr, Marker)
2:   {
3:      if(Marker == NotFTLData){
4:         ...
5:      }else if(Marker == FTLData){
6:         ...
7:      }
8:   }
```

In a variation of this embodiment, detailed operations regarding steps 35 and 38 may vary in such a manner that the marker is included in a function, such as a main function, to be executed by the CPU 21 for implementing the method of VST, and the marker indicates that data to be read from or written to a specific address or a specific range of addresses are unrelated to the firmware operation. The CPU 21 determines whether the physical address of one of the emulated volatile memory and the emulated non-volatile memory specified by the read operation corresponds to the specific address(es) indicated by the marker included in the function, and determines whether the another physical address of one of the emulated volatile memory and the emulated non-volatile memory specified by the write operation corresponds to the specific address (s) indicated by the marker included in the function. Table 2 below exemplifies the marker added in the function to indicate that data to be read from or written to the specific address(es) are unrelated to the firmware operation (see line 6 in the pseudocode of TestModeMain.c).

TABLE 2

```
TestModeMain.c
1:   main( )
2:   {
3:      While(1){
4:         (ReqType, ReqAddr, BufAddr1) = GetReq( );
6:         NotFTLData[BufAddr1] = true;
7:         HostReq(ReqType, ReqAddr, BufAddr1);
8:         NotFTLData[BufAddr1] = false;
9:      }
10:  }
FTL.c
1:   HostReq(ReqType, ReqAddr, BufAddr1)
2:   {
3:      if (ReqType == Read) {
4:         FlashPageRead(FlashAddr2, BufAddr2);
5:         FlashAddr1 = Buf[BufAddr2];
6:         FlashPageRead(FlashAddr1, BufAddr1);
7:      } else {
8:         FlashPageWrite(FlashAddr3, BufAddr1);
9:         Buf[BufAddr3] = FlashAddr3;
10:        FlashPageWrite(FlashAddr4, BufAddr3);
11:     }
12:  }
```

TABLE 2-continued

TestModeFlash.c
```
1:   FlashPageRead(FlashAddr, BufAddr)
2:   {
3:       if(NotFTLData[BufAddr] == true){
4:           ...
5:       }else{
6:           ...
7:       }
8:   }
```

In one embodiment, aside from the read request and the write request, the testing sequence further includes events that represent SSD power on/off or sudden power loss, addresses of initial bad flash blocks of the SSD, and read/program/erase failure events. In response to receipt of a notification of an event that represents one of power on, power off and a sudden power loss of the solid-state storage device, the CPU 21 refrains from fetching the read operation and the write operation, and destroys data stored in the emulated volatile memory.

Figure 5:
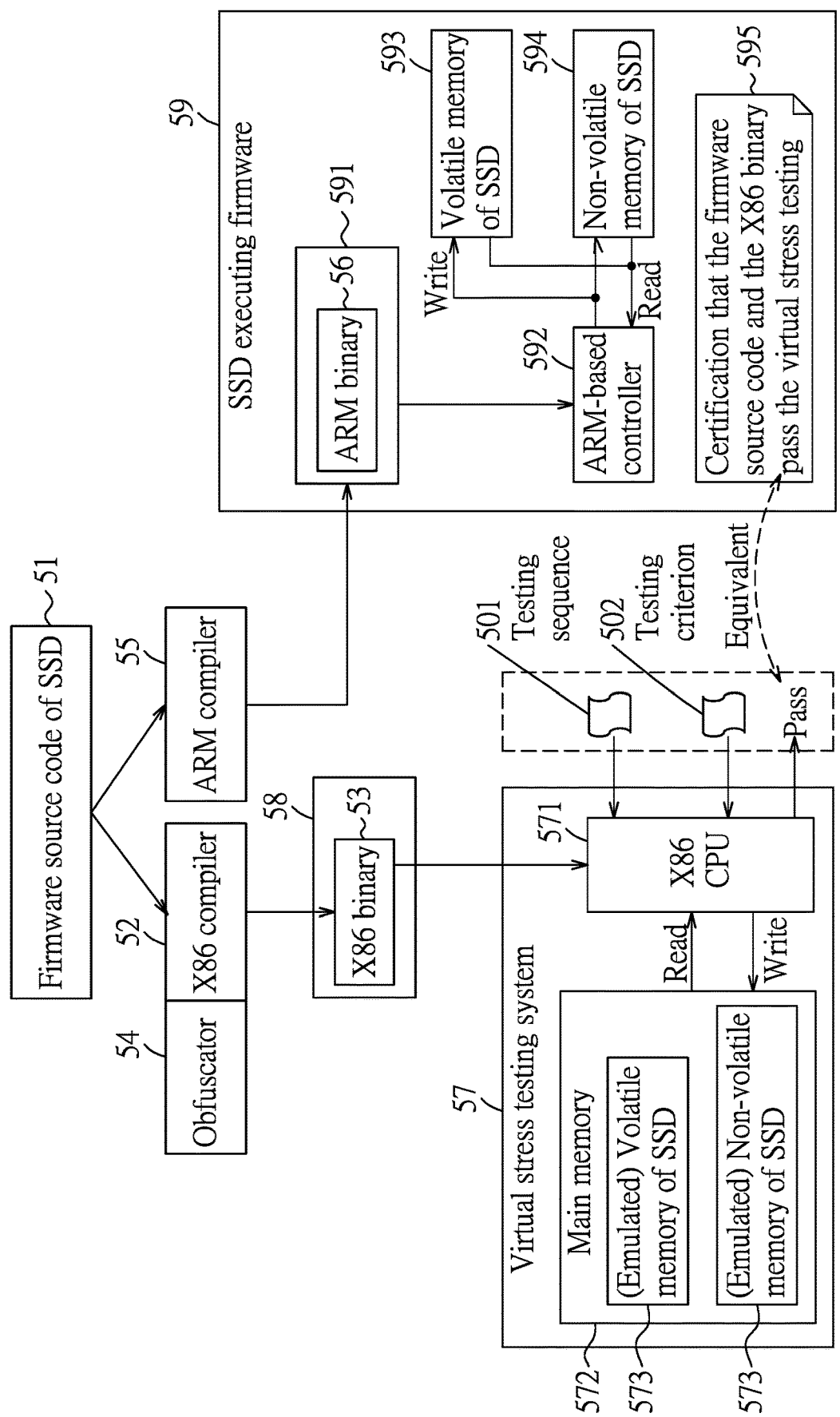
FIG. 5 is a block diagram illustrating more embodiments of the system for testing firmware of a solid-state storage device according to the disclosure.

Referring to FIG. 5, more embodiments of the system for testing firmware of a solid-state storage device according to the disclosure (referred to as a virtual stress testing system hereinafter) are illustrated.

In one embodiment, a firmware source code 51 of an SSD is tested by the virtual stress testing system. The firmware source code 51 includes one or more of the following operations that include instructions and function calls: write a volatile memory address of the SSD; read a volatile memory address of the SSD; write a non-volatile memory address of the SSD; and read a non-volatile memory address of the SSD.

In one embodiment, the firmware source code 51 further includes one or more of the following markers: a marker specifying that a write to the volatile or non-volatile memory of the SSD can be safely discarded by the virtual stress testing system; a marker specifying that a read to the volatile or non-volatile memory of the SSD can be safely discarded by the virtual stress testing system; a marker specifying that all reads and writes to a specific range of the volatile memory of the SSD can be safely discarded by the virtual stress testing system; and a marker specifying that all reads and writes to a specific range of the non-volatile memory of the SSD can be safely discarded by the virtual stress testing system.

In one embodiment, the firmware source code can be compiled by an X86 compiler 52 to generate an X86 binary 53. The X86 compiler 52 can cooperate with an obfuscator 54. The X86 compiler 52 can safely discard, change, or insert one or more operations according to the markers in the firmware source code 51. The obfuscator 54 can also safely discard, change, or insert one or more operations according to the markers in the firmware source code 51. The obfuscator 54 prevents one from reversely constructing the firmware source code 51 through the X86 binary 53 and from transforming the X86 binary 53 to a binary that an SSD can execute. One or more markers can be kept in the X86 binary 53. The firmware source code 51 can be compiled by an ARM compiler 55 to generate an ARM binary 56. The ARM compiler 55 can remove some or all markers from being included in the ARM binary 56.

In one embodiment, the virtual stress testing system 57 includes an X86 CPU 571 and a main memory 572. The main memory 572 emulates the volatile memory 593 and non-volatile memory 594 of the SSD to provide an emulated volatile memory 573 and an emulated non-volatile memory 574. The X86 CPU 571 fetches a testing sequence 501 and one or more testing criteria 502. According to the virtual stress testing sequence 501, the X86 CPU 571 fetches operations from a device 58 storing the X86 binary 53. The device 58 can be an optical disc, a disk drive, a DRAM memory, etc. According to the fetched operations, the X86 CPU 571 reads and writes the emulated volatile memory 573 and non-volatile memory 574 of the SSD. According to the markers kept in the X86 binary 53, the virtual stress testing system 57 (specifically, the X86 CPU 571) can safely discard one or more read or write operations. The virtual stress testing system 57 (specifically, the X86 CPU 571) monitors whether all the criteria 502 are met. If all the criteria 502 are met, the virtual stress testing system 57 (specifically, the X86 CPU 571) outputs a result indicating that the firmware source code 51 and the X86 binary 53 have passed the test.

In one embodiment, an SSD 59 includes a device 591 storing the ARM binary 56, an ARM-based controller 592, a volatile memory 593, and a non-volatile memory 594. The device 591 storing the ARM binary 56 may be SRAM, DRAM, flash memory, etc. The ARM-based controller 592 executes the operations of the ARM binary 56 and reads and writes the volatile memory 593 and non-volatile memory 594 accordingly. The SSD 59 further includes a certification 595 indicating that the firmware source code 51 and X86 binary 53 have passed the VST. The certification 595 can be a logo printed on an SSD product, a sticker on an SSD product, an SSD product description posted on the Internet, etc. In one embodiment, an electronic device includes a solid-state storage module associated with firmware which has passed the virtual stress test of this disclosure, and the electronic device is provided with the certification 595. When the electronic device is exemplified as a vehicle computer, a mobile device, or the like, the solid-state storage module may be an SSD or a SD card. When the electronic device is exemplified as an SSD, an SD card, a flash USB drive, or the like, the solid-state storage module is the SSD itself, the SD card itself, the flash USB drive itself, respectively.

In one embodiment, the certification 595 equivalently denotes that all the testing criteria 502 are met given the testing sequence 501. For example, the certification 595 can contain a pseudo-random number seed, and the testing sequence 501 is specified according to the seed.

In one embodiment, the X86 CPU 571 is other high-performance processors, and the X86 compiler 52 is changed accordingly. In one embodiment, the ARM-based controller 592 is based on other embedded processors, and the ARM compiler 55 is changed accordingly. In one embodiment, the virtual stress testing system 57 includes a disk and a network interface. In one embodiment, the non-volatile memory 594 of the SSD 59 is NAND flash, resistive memory, magnetoresistive memory, or phase change memory. In one embodiment, the volatile memory 593 of the SSD 59 is flip flops, register files, SRAM, pseudo SRAM, embedded DRAM, or DRAM.

By virtue of testing firmware of a solid-state storage device on a computing apparatus including a CPU that has relatively higher speed compared with an embedded processor on an SSD, stress tests can be performed on FTLs of firmware at a speed of up to 111 GB/s using single host CPU core or up to 375 GB/s using four host CPU cores, i.e., several hundred times faster than directly testing FTLs on SSD hardware.

With the above design of the data structure for emulation of the flash memory of an SSD and the introduction of the marker (s) for indicating that data to be read from or written to a physical address are unrelated to firmware operation, i.e., which data can be omitted during tests, an FTL can be executed on the PC or server at a multi-GHz frequency like a native PC or server program does. Furthermore, as shown in FIG. 2, multiple instances of FTL can be simultaneously under test, and the testing speed is limited by the memory system and x86 processors of PCs or servers instead of flash or a low-power processor. Once a failure occurs during FTL tests, engineers can easily reproduce the failure and analyze the failure in PC or server environments using generic debugging approaches such as the GNU debugger (GDB).

For example, seven new FTL bugs are found in the OpenSSD design using VST, which is a solid evidence for VST' s bug-discovering effectiveness. It would be difficult to discover and investigate these bugs without VST. Without using VST, it would be difficult for engineers to find out these bugs because the firmware is complex, the bugs are related to subtle boundary conditions, and some of the bugs only happen during garbage collection (GC), which needs a large number of write requests to trigger. In addition, although these bugs can also fail real SSD-based stress tests, without VST, reproducing and locating the bugs in real SSDs are still extremely challenging and time-consuming tasks.

To sum up, the method for testing firmware of a solid-state storage device according to the disclosure is able to perform FTL tests without any SSD hardware requirements or SSD speed limitations.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A method for testing firmware of a solid-state storage device to be implemented by a computing apparatus which includes a central processing unit (CPU), a main memory, and a storage that stores at least one testing criterion, the method comprising:

providing, by one of the main memory and the storage, binary codes generated by compiling the firmware of the solid-state storage device according to an instruction set architecture of the computing apparatus;

controlling, by the CPU, the main memory to emulate a volatile memory of the solid-state storage device to provide an emulated volatile memory;

controlling, by the CPU, the main memory to emulate anon-volatile memory of the solid-state storage device to provide an emulated non-volatile memory;

fetching, by the CPU, a testing sequence which includes a read request to access a logical address of the solid-state storage device and a write request to access another logical address of the solid-state storage device;

fetching, by the CPU according to the testing sequence, a read operation and a write operation from the binary codes;

determining, by the CPU, whether the read operation is associated with a marker indicating that data to be read from a physical address corresponding to the logical address are unrelated to firmware operation;

executing, by the CPU when it is determined that the read operation is not associated with the marker, the read operation thus fetched to read the data from the physical address of one of the emulated volatile memory and the emulated non-volatile memory specified by the read operation;

discarding, by the CPU when it is determined that the read operation is associated with the marker, a read of the data from the physical address specified by the read operation thus fetched;

determining, by the CPU, whether the write operation is associated with the marker indicating that data to be written to another physical address corresponding to the another logical address are unrelated to firmware operation;

executing, by the CPU when it is determined that the write operation is not associated with the marker, the write operation thus fetched to write the data to the another physical address of one of the emulated volatile memory and the emulated non-volatile memory specified by the write operation;

discarding, by the CPU when it is determined that the write operation is associated with the marker, a write of the data to the another physical address specified by the write operation thus fetched;

monitoring, by the CPU, whether processes of execution of the read operation and the write operation meet the testing criterion; and generating, by the CPU, a result of a test of the firmware when it is monitored that the testing criterion is met.

2. The method of claim 1, wherein the marker is added as an argument to the read operation and the write operation to indicate that the data to be read from the physical address specified by the read operation and the data to be written to the another physical address specified by the write operation are unrelated to the firmware operation.

3. The method of claim 2, wherein the firmware operation includes mapping between a logical address and a physical address.

4. The method of claim 2, wherein the step of determining whether the read operation is associated with a marker includes: determining whether an argument of the read operation is labeled by the marker indicating that data to be read from the physical address to be accessed are unrelated to the firmware operation; and the step of determining whether the write operation is associated with a marker includes: determining whether an argument of the write operation is labeled by the marker indicating that data to be written to the another physical address to be accessed are unrelated to the firmware operation.

5. The method of claim 1, wherein the marker is included in a function to be executed by the CPU for implementing the method, and indicates that data to be read from or written to a specific address are unrelated to the firmware operation.

6. The method of claim 5, wherein the firmware operation includes mapping between a logical address and a physical address.

7. The method of claim 5, wherein
the step of determining whether the read operation is associated with a marker includes: determining whether the physical address of one of the emulated volatile memory and the emulated non-volatile memory specified by the read operation corresponds to the specific address indicated by the marker included in the function; and
the step of determining whether the write operation is associated with a marker includes: determining whether the another physical address of one of the emulated volatile memory and the emulated non-volatile memory specified by the write operation corresponds to the specific address indicated by the marker included in the function.

8. The method of claim 1, wherein the testing criterion indicates a failed stress test and includes at least one of:
firmware not having processed requests for a period longer than a threshold;
an flash page being written twice without an erase;
multiple flash pages in a block being not written according to a predefined order; or
a logical block address (LBA) read out from a flash page being different from the LBA requested by a read request.

9. The method of claim 1, wherein the testing criterion indicates a passed stress test and includes at least one of:
a total number of read and write requests exceeding a multiple of a capacity of emulated flash;
a total number of erase operations exceeding a predetermined number; or
a total number of power-off and power-loss events exceeding a preset number.

10. The method of claim 1, wherein the step of controlling the main memory to emulate a non-volatile memory of the solid-state storage device includes:
establishing, by the CPU, a data structure for the non-volatile memory of the solid-state storage device in the main memory, the data structure including multiple subarrays, each of the subarrays representing a block of multiple flash pages, and each of the flash pages including an is_erased field, an lpn field, and a data pointer field, the is_erased field indicating whether the flash page is erased, the lpn field being a tag recording the logical page number of the flash page, the data pointer field being allocated memory space if data of the flash page are not omittable.

11. The method of claim 1, wherein the binary codes are generated by compiling a flash translation layer (FTL) of the firmware of the solid-state storage device according to the X86 instruction set architecture.

12. The method of claim 1, further comprising:
in response to receipt of a notification of an event that represents one of power on, power off and a sudden power loss of the solid-state storage device, by the CPU, refraining from fetching the read operation and the write operation, and destroying data stored in the emulated volatile memory.

13. A system for testing firmware of a solid-state storage device, the system comprising a computing apparatus which includes:
a main memory;
a storage storing a testing criterion and configured to provide binary codes which are generated by compiling the firmware of the solid-state storage device according to an instruction set architecture of the computing apparatus; and
a central processing unit (CPU) electrically connected to said main memory and said storage, and configured to
control said main memory to emulate a volatile memory and a non-volatile memory of the solid-state storage device to provide an emulated volatile memory and an emulated non-volatile memory,
fetch a testing sequence which includes a read request to access a logical address of the solid-state storage device and a write request to access another logical address of the solid-state storage device,
fetch, according to the testing sequence, a read operation and a write operation from the binary codes stored in said storage,
determine whether the read operation is associated with a marker indicating that data to be read from a physical address corresponding to the logical address are unrelated to firmware operation,
execute, when it is determined that the read operation is not associated with the marker, the read operation thus fetched to read the data from the physical address of one of the emulated volatile memory and the emulated non-volatile memory specified by the read operation,
discard, when it is determined that the read operation is associated with the marker, a read of the data from the physical address specified by the read operation thus fetched,
determine whether the write operation is associated with the marker indicating that data to be written to another physical address corresponding to the another logical address are unrelated to firmware operation,
execute, when it is determined that the write operation is not associated with the marker, the write operation thus fetched to write data to the another physical address of one of the emulated volatile memory and the emulated non-volatile memory specified by the write operation,
discard, when it is determined that the write operation is associated with the marker, a write of the data to the another physical address specified by the write operation thus fetched,
monitor whether processes of execution of the read operation and the write operation meet the testing criterion, and
generate a result of a test of the firmware when it is monitored that the testing criterion is met.

14. The system of claim 13, wherein the marker is added as an argument to the read operation and the write operation to indicate that the data to be read from the physical address specified by the read operation and the data to be written to the another physical address specified by the write operation are unrelated to the firmware operation.

15. The system of claim 14, wherein the firmware operation includes mapping between a logical address and a physical address.

16. The system of claim 14, wherein said CPU is further configured to:
   determine whether an argument of the read operation is labeled by the marker indicating that data to be read from the physical address to be accessed are unrelated to the firmware operation; and
   determine whether an argument of the write operation is labeled by the marker indicating that data to be written to the another physical address to be accessed are unrelated to the firmware operation.

17. The system of claim 13, wherein the marker is included in a function to be executed by said CPU for implementing testing firmware, and indicates that data to be read from or written to a specific address are unrelated to the firmware operation.

18. The system of claim 17, wherein the firmware operation includes mapping between a logical address and a physical address.

19. The system of claim 17, wherein said CPU is further configured to:
   determine whether the physical address of one of the emulated volatile memory and the emulated non-volatile memory specified by the read operation corresponds to the specific address indicated by the marker included in the function; and
   determine whether the another physical address of one of the emulated volatile memory and the emulated non-volatile memory specified by the write operation corresponds to the specific address indicated by the marker included in the function.

20. The method of claim 13, wherein the testing criterion indicates a failed stress test and includes at least one of:
   firmware not having processed requests for a period longer than a threshold;
   an flash page being written twice without an erase;
   multiple flash pages in a block being not written according to a predefined order; or
   a logical block address (LBA) read out from a flash page being different from the LBA requested by a read request.

21. The method of claim 13, wherein the testing criterion indicates a passed stress test and includes at least one of:
   a total number of read and write requests exceeding a multiple of a capacity of emulated flash;
   a total number of erase operations exceeding a predetermined number; or
   a total number of power-off and power-loss events exceeding a preset number.

22. The system of claim 13, wherein said CPU is further configured to establish a data structure for the non-volatile memory of the solid-state storage device in the main memory, the data structure including multiple subarrays, each of the subarrays representing a block of multiple flash pages, and each of the flash pages including an is_erased field, an lpn field, and a data pointer field, the is_erased field indicating whether the flash page is_erased, the lpn field being a tag recording the logical page number of the flash page, the data pointer field being allocated memory space if data of the flash page are not omittable.

23. The system of claim 13, wherein the binary codes are generated by compiling a flash translation layer (FTL) of the firmware of the solid-state storage device according to the X86 instruction set architecture.

24. The system of claim 13, said CPU is further configured to, in response to receipt of a notification of an event that represents one of power on, power off and a sudden power loss of the solid-state storage device, refrains from fetching the read operation and the write operation, and destroying data stored in the emulated volatile memory.

25. An electronic device comprising:
   a solid-state storage module associated with firmware which has passed a test that is performed through the method for testing firmware of a solid-state storage device as claimed in claim 1; and
   wherein said electronic device is provided with a certification indicating that the firmware of said solid-state storage module has passed the test.

26. The electronic device of claim 25, wherein said certification is one of a logo printed on the electronic device, a sticker on the electronic device, and a description posted on the Internet.

* * * * *